(12) United States Patent
Sinha et al.

(10) Patent No.: US 8,619,464 B1
(45) Date of Patent: Dec. 31, 2013

(54) STATIC RANDOM-ACCESS MEMORY HAVING READ CIRCUITRY WITH CAPACITIVE STORAGE

(75) Inventors: Shankar Sinha, Redwood City, CA (US); Brian Wong, Sunnyvale, CA (US); Shih-Lin S. Lee, San Jose, CA (US); Abhishek Sharma, San Jose, CA (US)

(73) Assignee: Altera Corporation, San Jose, CA (US)

( * ) Notice: Subject to any disclaimer, the term of this patent is extended or adjusted under 35 U.S.C. 154(b) by 78 days.

(21) Appl. No.: 13/219,537

(22) Filed: Aug. 26, 2011

(51) Int. Cl.
*G11C 11/00* (2006.01)

(52) U.S. Cl.
USPC .................. 365/154; 365/156; 365/189.14

(58) Field of Classification Search
None
See application file for complete search history.

(56) References Cited

U.S. PATENT DOCUMENTS

| | | | |
|---|---|---|---|
| 4,802,128 A | 1/1989 | Watanabe et al. | |
| 4,852,060 A | 7/1989 | Rockett, Jr. | |
| 5,247,479 A * | 9/1993 | Young | 365/189.05 |
| 6,091,627 A | 7/2000 | Luo et al. | |
| 6,118,689 A * | 9/2000 | Kuo et al. | 365/154 |
| 6,175,533 B1 | 1/2001 | Lee et al. | |
| 6,876,572 B2 * | 4/2005 | Turner | 365/156 |
| 7,009,871 B1 * | 3/2006 | Kawasumi | 365/154 |
| 7,088,607 B2 * | 8/2006 | Matsuzawa et al. | 365/153 |
| 7,233,518 B2 | 6/2007 | Liu | |
| 7,366,006 B2 | 4/2008 | Zhang | |

OTHER PUBLICATIONS

Rahim, Irfan, et al. U.S. Appl. No. 12/571,346, filed Sep. 30, 2009.*
Rahim, Irfan, et al. U.S. Appl. No. 12/568,638, filed Sep. 28, 2009.*
Xu, Yanzhong, et al. U.S. Appl. No. 12/571,143, filed Sep. 30, 2009.*
Lee, Andy, et al. U.S. Appl. No. 12/391,230, filed Feb. 23, 2009.*
Hsieh, Chen-Ju, et al. U.S. Appl. No. 12/101,114, filed Apr. 10, 2008.*
Calin, et al. "Upset Hardened Memory Design for Submicron CMOS Technology," IEEE Transactionso n Nuclear Science, vol. 43, No. 6, Dec. 1996.

* cited by examiner

*Primary Examiner* — Alexander Sofocleous
(74) *Attorney, Agent, or Firm* — Treyz Law Group; G. Victor Treyz; Jason Tsai

(57) ABSTRACT

Integrated circuits may have arrays of memory elements. Data may be loaded into the memory elements and read from the memory elements using data lines. Address lines may be used to apply address signals to write address transistors and read circuitry. A memory element may include a bistable storage element. Read circuitry may be coupled between the bistable storage element and a data line. The read circuitry may include a data storage node. A capacitor may be coupled between the data storage node and ground and may be used in storing preloaded data from the bistable storage element. The read circuitry may include a transistor that is coupled between the bistable storage element and the data storage node and a transistor that is coupled between the data storage node and the data line.

18 Claims, 9 Drawing Sheets

STATIC RANDOM-ACCESS MEMORY HAVING READ CIRCUITRY WITH CAPACITIVE STORAGE

BACKGROUND

This relates to memory, and, more particularly, to volatile memory.

Integrated circuits often contain volatile memory elements such as static random-access memory elements. Access transistors are used in reading and writing data for the static random-access memory elements.

Volatile memory elements such as static random-access memory elements may be used to store data during operation of a digital circuit. In the context of programmable logic device integrated circuits, static random-access memory can be used as user memory or as configuration random-access memory that stores configuration data.

It can be challenging to design static random-access memory. For example, it can be difficult to balance read and write margins. In a cell that has a single access transistor, decreasing the size of the access transistor may improve the read margin of the cell at the expense of a degraded write margin. Increasing the size of the access transistor may improve write margin at the expense of decreased read margin.

In dual port static random-access memory, data can be accessed using two different ports. If care is not taken, write operations and read operations occurring simultaneously on different ports can interfere with each other. Interference between the ports can be avoided by imposing restrictions on simultaneous read and write operations such as restrictions requiring that read operations be completed before write operations. However, such restrictions tend to slow operation of the memory.

SUMMARY

Integrated circuits may have arrays of memory elements. The memory elements may be used to store data during operation of an integrated circuit. In a programmable integrated circuit, the memory elements may be used to store user data that is produced by and consumed by digital logic on the integrated circuit. Memory elements can also be used to store configuration data.

Data may be loaded into the memory elements and read from the memory elements using data lines. Address lines may be used to apply address signals to write address transistors and read circuitry. The address signals may be asserted to write data into the memory elements using the write address transistors and to read data from the memory elements using the read circuitry.

Each memory element may include a bistable storage element. The bistable storage element may be based on a pair of cross-coupled inverters or other bistable circuitry and may be used to store data.

Read circuitry may be coupled between the bistable storage element and a data line. The read circuitry may include a data storage node. A capacitor may be coupled between the data storage node and ground and may be used in storing preloaded data from the bistable storage element.

The read circuitry for each memory element may include a transistor that is coupled between the bistable storage element and the data storage node and a transistor that is coupled between the data storage node and the data line. The transistors of the read circuitry may be controlled using a read address line.

Further features of the invention, its nature and various advantages will be more apparent from the accompanying drawings and the following detailed description of the preferred embodiments.

DETAILED DESCRIPTION

Integrated circuits may be provided with random-access memory. The integrated circuits may be memory chips, digital signal processing circuits with memory, microprocessors, application-specific integrated circuits with memory, programmable integrated circuits such as programmable logic device integrated circuits, or any other suitable type of integrated circuit. For clarity, the use of memory elements in the context of programmable integrated circuits such as programmable logic device integrated circuits in which memory is used as user memory or configuration memory for storing programming data is sometimes described herein as an example. This is, however, merely illustrative. Any suitable type of integrated circuit may be provided with random-access memory elements if desired.

Figure 1:
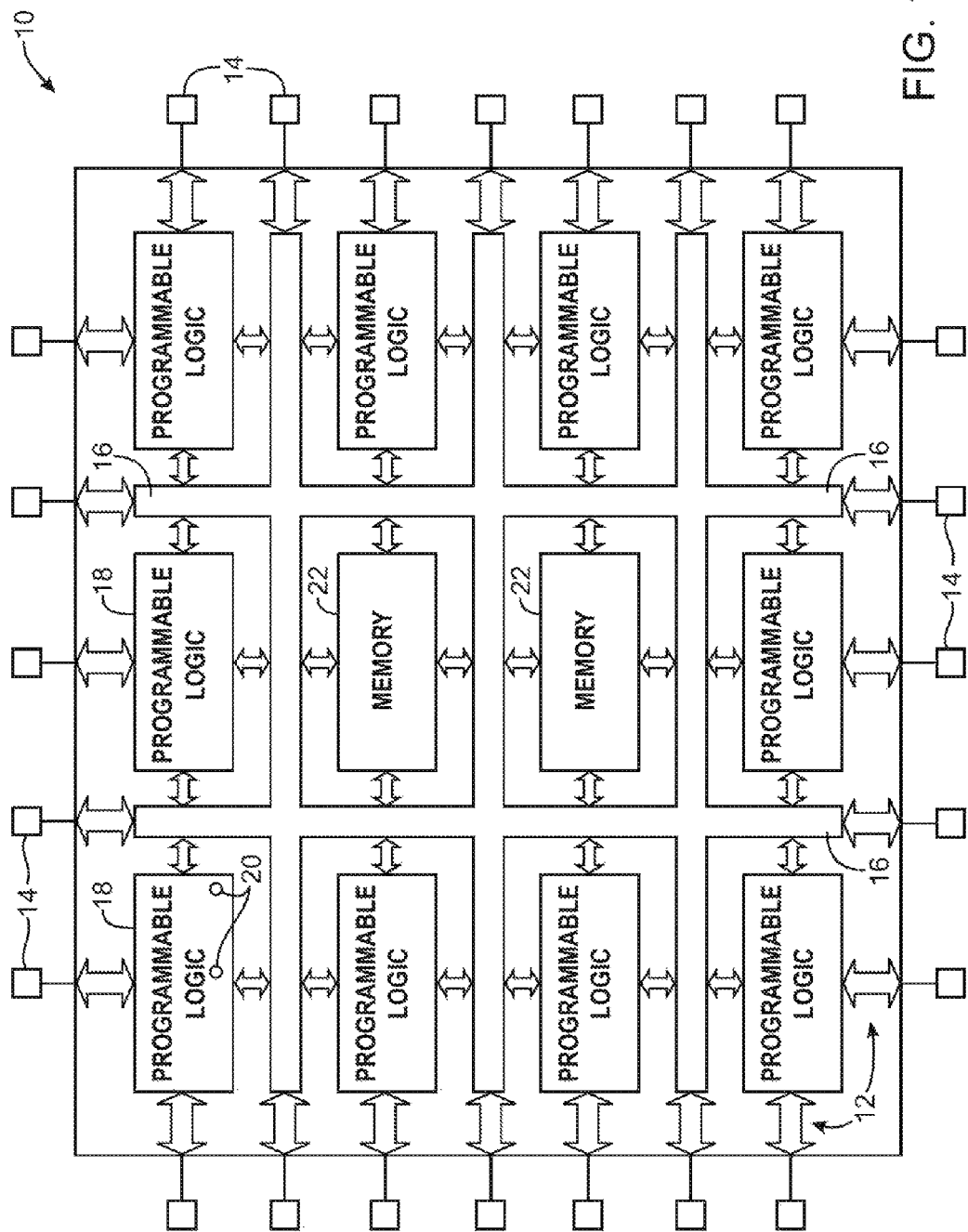
FIG. 1 is a diagram of an illustrative integrated circuit of the type that may include static random-access memory in accordance with an embodiment of the present invention the present invention.

An illustrative programmable circuit such as a programmable logic device integrated circuit or other integrated circuit 10 that may be provided with random-access memory is shown in FIG. 1. Integrated circuit 10 may have input/output circuitry 12 for driving signals off of integrated circuit 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and may include programmable interconnects (i.e., programmable connections between respective fixed interconnects). If desired, integrated circuit 10 may include circuitry such as programmable logic 18 and/or hardwired logic. The circuitry of integrated circuit 10 may include combinational and sequential logic circuitry. Programmable logic 18 may be configured to perform a custom logic function. The programmable interconnects associated with interconnection resources may be considered to be a part of programmable logic 18.

Integrated circuit 10 may contain volatile memory elements. The volatile memory elements may be organized in arrays such as memory arrays (blocks) 22. Memory arrays 22, which may sometimes be referred to as embedded array blocks or user memory may be used in storing digital data during operation of logic circuitry on integrated circuit 10.

If desired, volatile memory elements may also be used as configuration random-access memory (CRAM) that stores configuration data (see, e.g., configuration random-access memory elements 200 of FIG. 1). Once loaded with configuration data, these memory elements may each provide a corresponding static control output signal that controls the state of a pass transistor or other associated logic component in programmable logic 18. Configuration random-access memory cells may produce output signals that are applied to the gates of metal-oxide-semiconductor (MOS) transistors. These transistors may include n-channel metal-oxide-semiconductor (NMOS) pass transistors in programmable components such as multiplexers. Some of the output signals may be used to control p-channel metal-oxide-semiconductor (PMOS) power-down transistors or other p-channel metal-oxide-semiconductor transistors.

The volatile memory elements in device 10 may be formed from a number of transistors configured to form a bistable storage element. With one suitable arrangement, which is sometimes described herein as an example, the bistable storage elements may be formed from cross-coupled inverters. Bistable storage elements may also be formed using other transistor configurations (e.g., using more transistors than would be used in a cross-coupled inverter configuration).

The circuitry of integrated circuit 10 may be organized using any suitable architecture. As an example, the circuitry of integrated circuit 10 may be organized in a series of rows and columns of circuit regions (e.g., programmable logic regions) each of which contains multiple smaller regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of integrated circuit 10 may be arranged in more levels or layers in which multiple large regions are interconnected to form still larger portions of circuitry. Still other device arrangements may use circuitry that is not arranged in rows and columns.

Figure 2:
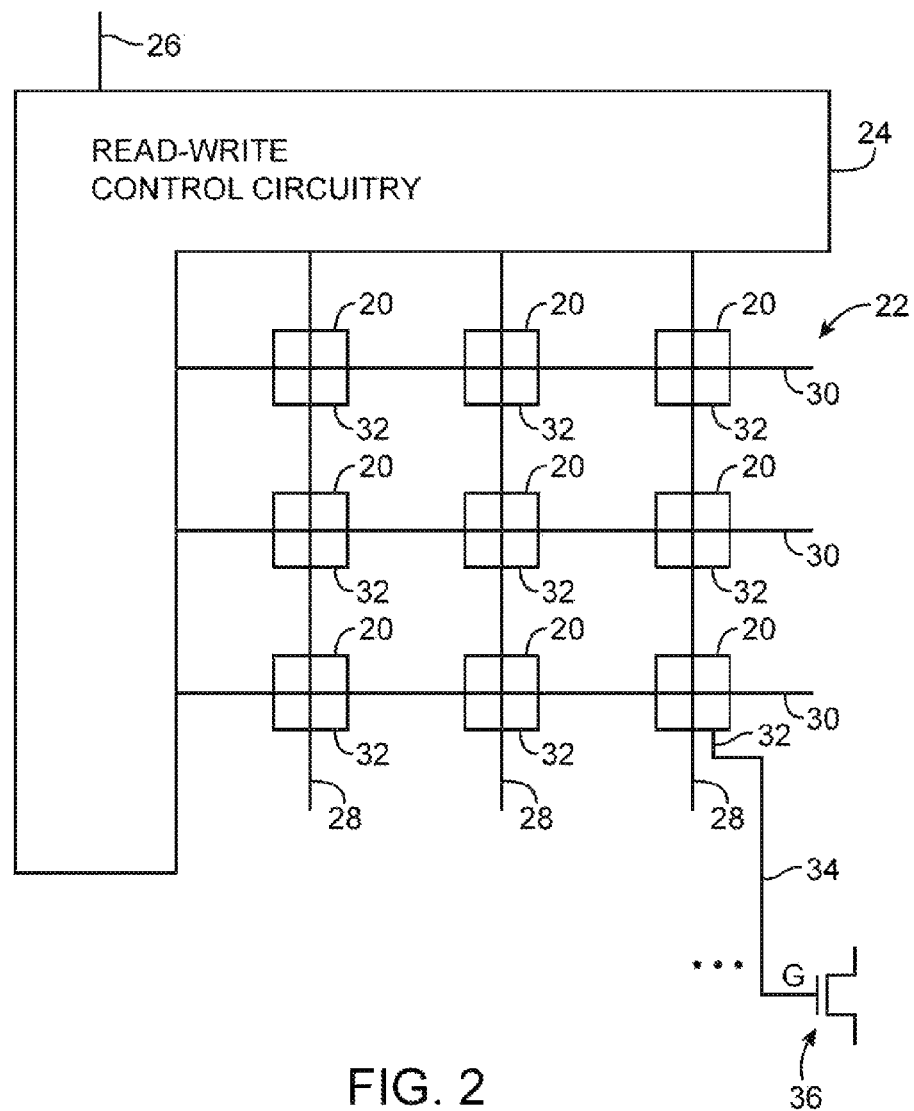
FIG. 2 is a diagram of an array of memory elements an associated control circuitry in accordance with an embodiment of the present invention.

When memory elements are arranged in an array, horizontal and vertical conductors and associated control circuitry may be used to write data into the memory elements and may be used to read data from the memory elements. An illustrative data loading arrangement is shown in FIG. 2. Illustrative array 22 of FIG. 2 has memory elements 20. Memory elements 20 may be volatile memory elements in a block of user memory (e.g., an embedded array block or other array of static random-access memory). In some embodiments, memory elements 20 may be CRAM cells such as CRAM cells 200 of FIG. 1. In CRAM arrangements, memory elements 20 may have outputs 32 with which static output signals are applied to the gates of corresponding programmable transistors. For example, paths such as path 34 may be used to apply output signals to a gate G of a corresponding programmable transistor 36. In user memory arrays (i.e., in embedded array block configurations), outputs 32 may be omitted.

The arrangement of FIG. 2 has a 3×3 array 22 of memory elements 20. Device 10 may, if desired have more rows and columns (e.g., hundreds or thousands of rows and columns). A 3×3 array is used in FIG. 2 as an example.

Memory elements 20 may be powered using power supply voltages such as a first power supply voltage Vcc and a second power supply voltage Vss. Power supply voltage Vcc may be, for example, a positive power supply voltage. Power supply voltage Vss may be, for example, a ground power supply voltage.

Examples of suitable voltage levels that may be used for power supply voltage Vcc are voltages in the range of 0.4 to 1.0 volts (as examples). Vcc values of less than 0.4 volts or more than 1.0 volts may be used if desired. An example of a suitable voltage level that may be used for power supply voltage Vss is 0 volts. Vss values of less than 0 volts or more than 0 volts may be used if desired.

Read-write control circuitry 24 may obtain data to be loaded into array 22 via path 26. Data that has been read from array 22 may be provided to path 26 from memory elements 20 by read-write control circuitry 24.

Address signals on one or more address lines 30 (sometimes referred to as word lines or access control signal lines) may be used to select which cells are accessed during read and write operations. During data reading operations, read circuitry associated with memory elements 20 in array 22 may be used to read data from selected memory elements 20. The data that is read from the memory elements during the read operations may be conveyed to read-write control circuitry 24 via one or more data lines 28 (sometimes referred to as bit lines). During data writing operations, write circuitry associated with memory elements (e.g., one or more write address transistors) may be used to load data from read-write control circuitry 24 (e.g. data from register circuitry in read-write control circuitry) into selected memory elements 20 via data lines 28.

There may be any suitable number of address lines associated with each row of array 22 (e.g., one, two, more than two, etc.) and any suitable number of data lines associated with each column of array 22 (e.g., one, two or more, etc.).

Figure 3:
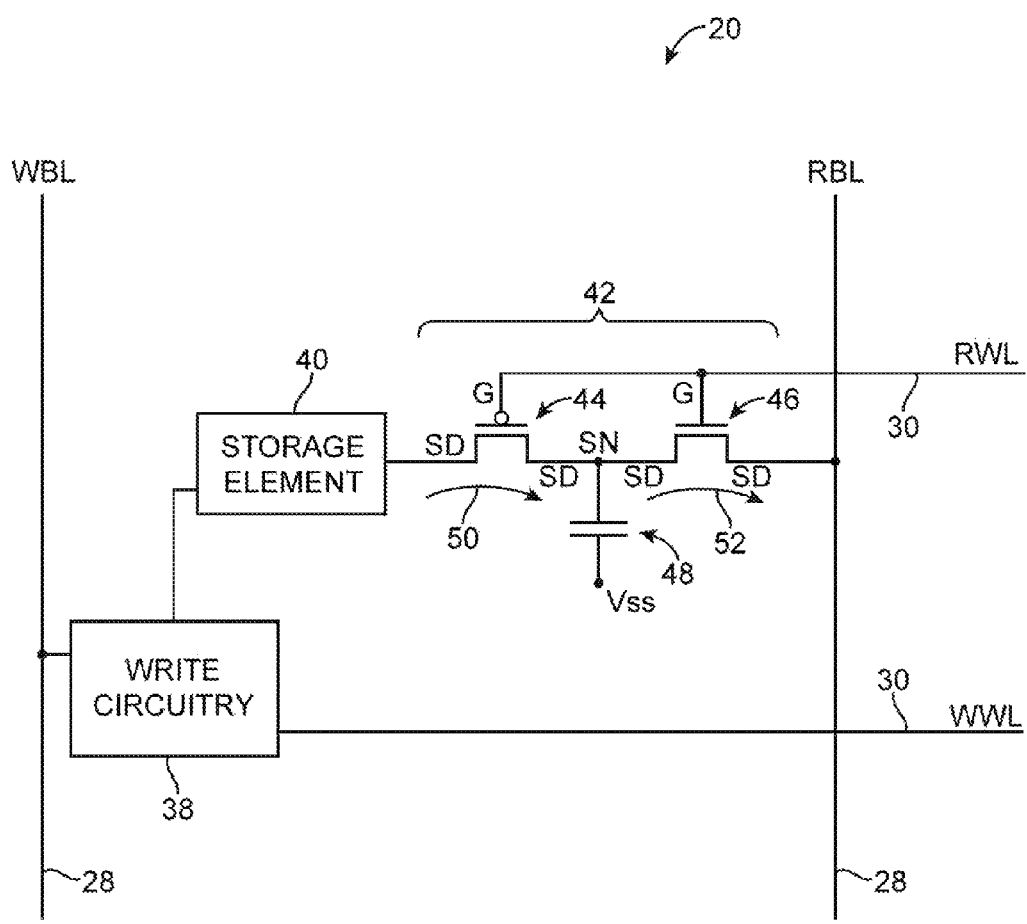
FIG. 3 is a circuit diagram of a memory circuit having a bistable storage element and a read circuit with a capacitive data storage element in accordance with an embodiment of the present invention.

Memory elements 20 may include access transistors (sometimes referred to as address transistors) and associated support circuitry for reading and writing data from a bistable storage element. An illustrative memory element 20 is shown in FIG. 3. As shown in FIG. 3, memory element 20 may have a bistable storage element such as bistable storage element 40. Bistable storage element 40 may be used to store digital data (e.g., a logic one or a logic zero). With one suitable arrangement, bistable storage element 40 may be based on a pair of cross-coupled inverters. Bistable storage element designs that use different circuits may be used in memory element 20 if desired. The use of cross-coupled inverter circuitry in forming bistable storage elements such as storage element 40 of FIG. 3 is merely illustrative.

Data may be conveyed to and from memory element 20 using data lines 28. In the example of FIG. 3, memory element 20 has two associated data lines: data line WBL (a write bit line) and data line RBL (a read bit line). Memory elements with other numbers of data lines may be used in integrated circuit 10 if desired.

Control signals for memory element 20 may be conveyed to memory element 20 using address lines 30. In the example of FIG. 3, memory element 20 has two associated address lines: address line RWL (a read word line) and address line WWL (a write word line).

To write data into memory element 20 (e.g., to store data in bistable storage element 40), data may be placed on data line WBL by read-write control circuitry 24 (FIG. 2). Once data has been placed on line WBL, a write address signal may be asserted (e.g., taken high) on address line WWL. The assertion of the write address signal may direct write circuitry 38 to load the data on data line WBL into storage element 40.

Read circuitry 42 may be used in reading data from storage element 40. Read circuitry 42 may include transistors such as p-channel metal-oxide-semiconductor transistor 44 and n-channel metal-oxide-semiconductor transistor 46. Capacitor 48 may be coupled between data storage node SN and terminal Vss (e.g., a ground terminal).

Capacitor 48 may be used to store charge and therefore may serve as a temporary data storage circuit (sometimes referred to as a temporary memory element) that can buffer data as the data is being read out from storage element 40. The gates G of transistors 44 and 46 may receive a read address signal from read address line RWL. When the read address signal is taken low (e.g., to Vss), transistor 44 may be turned on and transistor 46 may be turned off. In this configuration, a short circuit is formed between the source-drain terminals (SD) of transistor 44. The short circuit through transistor 44 allows data from storage element 40 to be transferred onto storage node SD, as indicated by arrow 50. When the read address signal is taken high (e.g., to Vcc), transistor 44 may be turned off and transistor 46 may be turned on. In this configuration, transistor 44 forms an open circuit that isolates capacitive data storage node SN from storage element 40 and transistor 46 forms a short circuit between its source-drain terminals SD. The short circuit formed by turning on transistor 46 allows data from storage node SN to be conveyed through transistor 46 to read data line RBL, as indicated by arrow 52.

The use of read circuitry such as read circuitry 42 of FIG. 3 to read data from storage element 40 helps to decouple data line RBL from storage element 40. During reading operations, data is temporarily loaded onto data storage node SN and is then loaded from storage node SN onto data line RBL. With the use of separate write circuitry 38 and read circuitry 42, write transistor size and read transistor size can be adjusted independently (e.g., write transistor size can be increased without decreasing read margin and read transistor size can be decreased without decreasing write margin). Read and write signals can also be asserted simultaneously using arrangements of the type shown in FIG. 3.

When the read address signal is low (deasserted), transistor 44 will be on and data from storage element 40 will be preloaded into storage element 48. When it is desired to read data from memory element 20, a read address signal on read address line RWL may be asserted (e.g., taken high). The signal on read address line RWL may be asserted at the same time as a write address signal on write address line WWL is asserted (e.g., taken high). Assertion of the read address signal will cause data that has been preloaded onto data storage node SN to be loaded onto data line RBL. Because transistor 44 is off, data can be simultaneously written into storage element 40 from data line WBL using write circuitry 38 without interfering with the data reading process.

Figure 4:
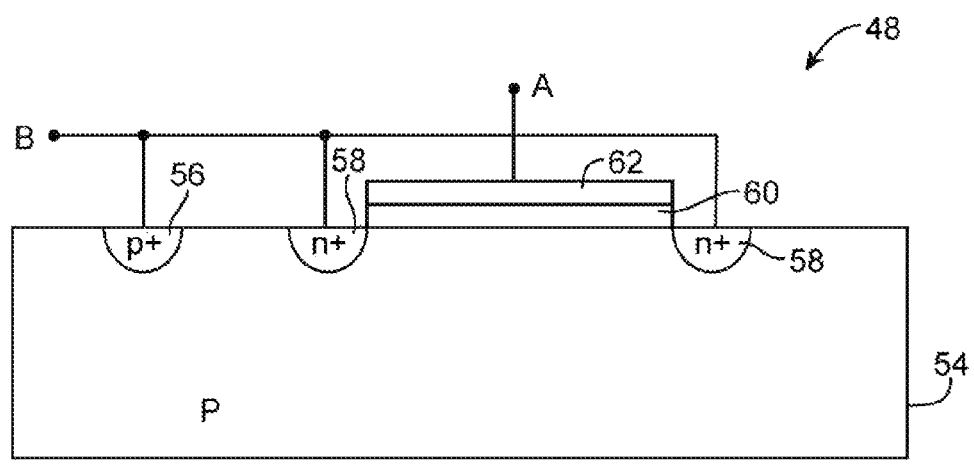
FIG. 4 is a cross-sectional side view of an illustrative capacitor based on a metal-oxide-semiconductor transistor structure of the type that may be used as a capacitive storage element in the read circuitry of a static random-access memory element in accordance with an embodiment of the present invention.

Capacitor 48 may be formed using any suitable type of charge storage structure. An illustrative configuration in which capacitor 48 has been formed from a metal-oxide-semiconductor (MOS) capacitor structure is shown in FIG. 4. As shown in FIG. 4, capacitor 48 may be formed from a semiconductor substrate such as substrate 54. Substrate 54 may be, for example, a silicon substrate. In the FIG. 4 example, substrate 54 has been doped with p-type dopant. This is merely illustrative. Substrate 54 may be implemented using an n-type semiconductor if desired.

Capacitor 48 of FIG. 4 may have a first terminal (terminal A) that is connected to gate conductor 62. Gate conductor 62 may be formed on gate insulator 60. Gate conductor 62 may be formed from a conductive material such as metal, doped polysilicon (e.g., silicided polysilicon), or other conductive materials. Gate insulator 60 may be formed from silicon oxide, high-K dielectrics (e.g., hafnium-based oxides), or other dielectric materials. Capacitor 48 may have a second terminal (terminal B) that is connected to p+ region 56 (e.g., a body terminal), and n+ regions 58 (e.g., source-drain regions).

MOS capacitor structures such as structure 48 of FIG. 4 may be fabricated using the processing steps that are used to form MOS transistors elsewhere on substrate 54.

Figure 5:
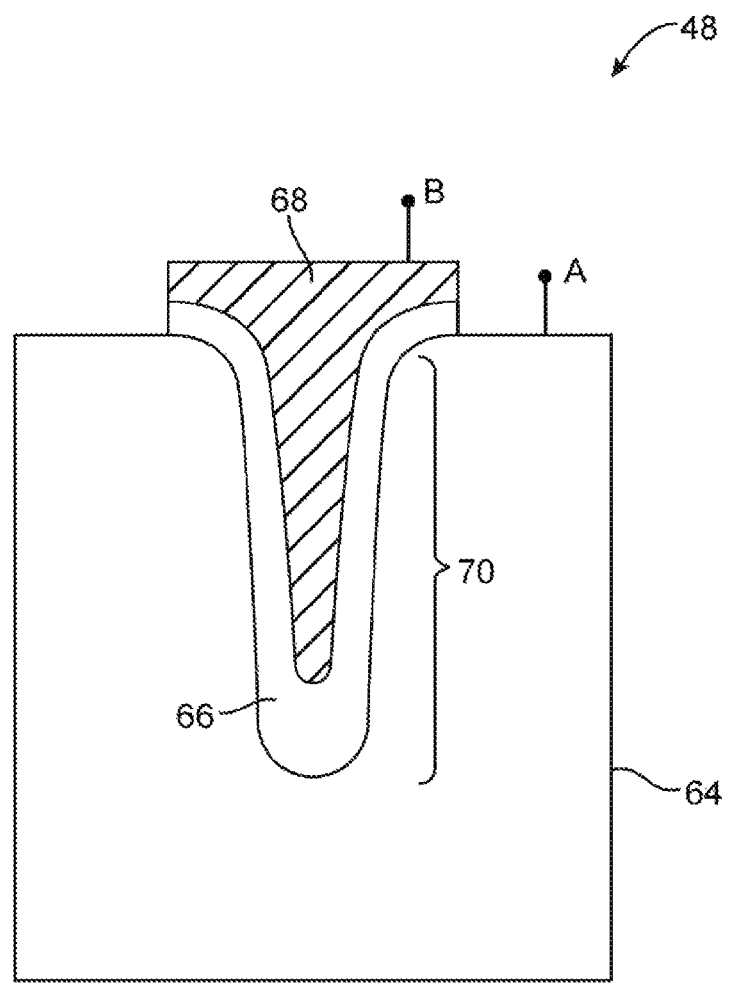
FIG. 5 is a cross-sectional side view of an illustrative trench capacitor of the type that may be used as a capacitive storage element in the read circuitry of a static random-access memory element in accordance with an embodiment of the present invention.

If desired, capacitor 48 may be formed using a trench capacitor structure of the type shown in FIG. 5. As shown in FIG. 5, capacitor 48 may have a first terminal (terminal A) that is coupled to substrate 64. Substrate 64 may be, for example, a semiconductor substrate such as a silicon substrate. Trench 70 may be formed in substrate 64. Dielectric 66 may be formed on the sidewalls of trench 70. Dielectric 66 may be, for example, a dielectric such as silicon oxide, a high-K dielectric such as a hafnium-based oxide, or other dielectric materials. Capacitor 48 may have a second terminal (terminal B) that is coupled to conductive material 68 (e.g., metal, doped polysilicon, etc.).

Figure 6:
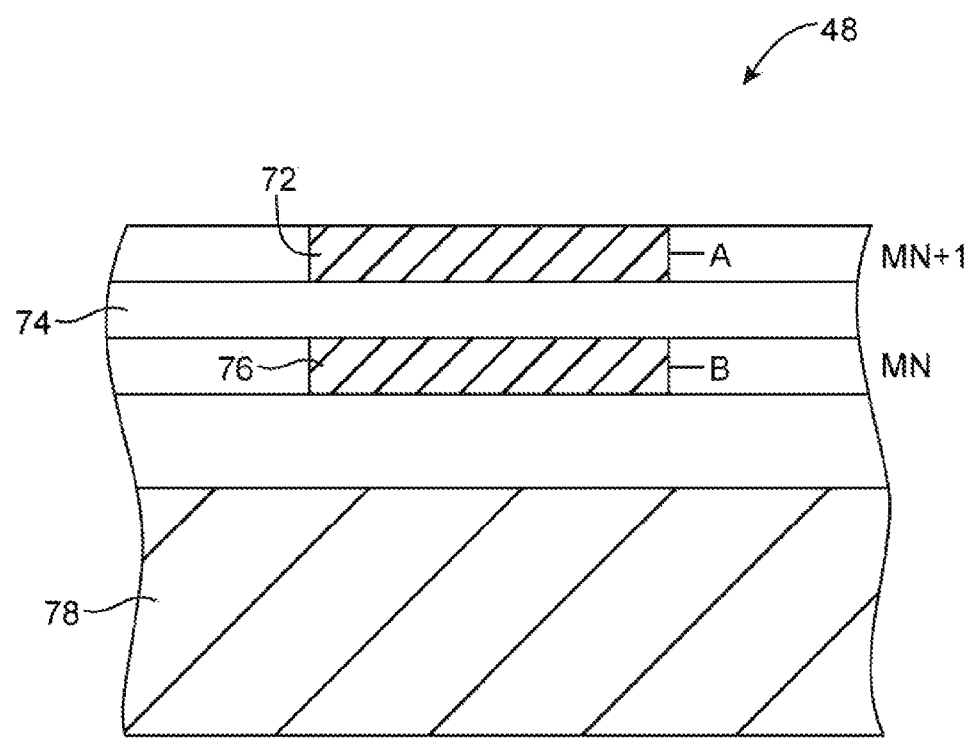
FIG. 6 is a cross-sectional side view of an illustrative metal-insulator-metal capacitor of the type that may be used as a capacitive storage element in the read circuitry of a static random-access memory cell in accordance with an embodiment of the present invention.

In the illustrative example of FIG. 6, capacitor 48 has been formed using a metal-insulator-metal (MIM) structure. Layers such as patterned metal layers MN and MN+1 may form part of a dielectric stack on substrate 78. Substrate 78 may be, for example, a silicon wafer. The layers in the dielectric stack may include metal layers (e.g., layers MN and MN+1 and other layers that include patterned metal traces in a dielectric such as silicon oxide) and via layers (e.g., layers that are interposed between respective metal layers and that form vertical conductive paths). The conductive traces of the metal layers such as trace 72 in metal layer MN+1 and trace 76 in metal layer MN may be used in forming electrodes for capacitor 48. For example, trace 72 may form a first electrode (terminal A) for capacitor 48 and trace 76 may form a second electrode (terminal B) for capacitor 48. A dielectric layer such as layer 74 may be interposed between electrodes 74 and 76 to form capacitor 48.

Figure 7:
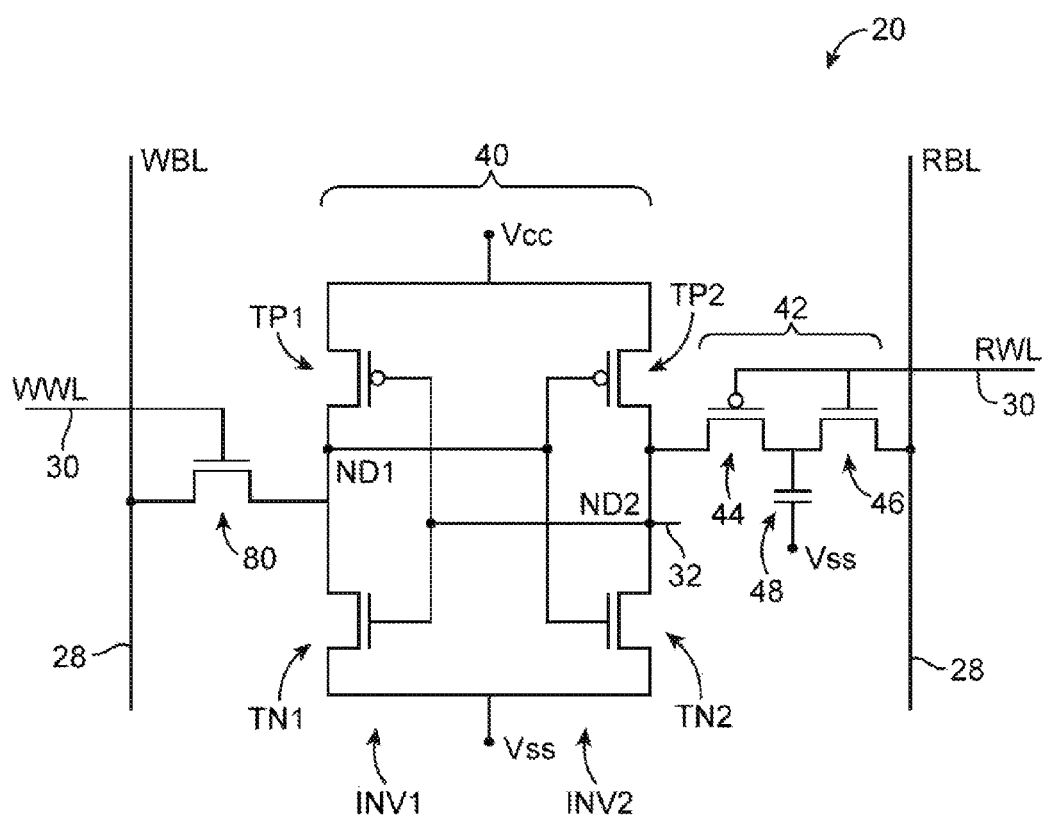
FIG. 7 is a circuit diagram of an illustrative dual port memory element having a write address transistor and a read circuit with a capacitive storage element in accordance with an embodiment of the present invention.

An illustrative configuration that may be used for memory element 20 is shown in FIG. 7. As shown in FIG. 7, memory element 20 may include a bistable storage element such as bistable storage element 40. Bistable storage element 40 may include cross-coupled inverters INV1 and INV2. Data may be stored on data storage node ND2 and corresponding complementary data may be stored on data storage node ND1. Node ND2 may be coupled to memory element output 32. When a logic one is loaded into memory element 20, the voltage on node ND2 will be high (e.g., Vcc). When a logic zero is loaded into memory element 20, the voltage on node ND2 will be low (e.g., Vss).

Inverter INV1 may have p-channel metal-oxide-semiconductor (PMOS) transistor TP1 and n-channel metal-oxide-semiconductor (NMOS) transistor TN1. Inverter INV2 may have PMOS transistor TP2 and NMOS transistor TN2. Node ND1 may be located at the input to inverter INV2 and the output of inverter INV1. Node ND2 may be connected to the input of inverter INV1 and the output of inverter INV2 (i.e., inverters INV1 and INV2 may be cross coupled). The transistors of inverter INV1 may be coupled in series between a terminal that receives positive power supply voltage Vcc and a terminal that receives ground power supply voltage Vss. The transistors of inverter INV2 may also be coupled in series between Vcc and Vss.

Bistable storage element 40 may exhibit two stable states. In its first state, node ND1 may be low while node ND2 is high (i.e., the bistable storage element and memory element 20 are storing a logic one). In its second state, node ND1 may be high while node ND2 is low (i.e., the bistable storage element and memory element 20 are storing a logic zero).

Write address transistor 80 may have a gate that is coupled to write address line WWL and may have source-drain terminals that are coupled in series between data line WBL (e.g., a write data line) and node ND1. When it is desired to write data from data line WBL into storage element 40, write address transistor 80 (which forms a write port for memory element 20) may be turned on by asserting the address signal on address line WWL (i.e., by taking the address signal on line WWL high).

Read circuitry 42 (which forms a read port for memory 20) may be coupled between output node ND2 and data line RBL (i.e., a read bit line). A read address signal on read address line RWL may be used in controlling read circuitry 42. When the signal on line RWL is low (e.g., Vss), transistor 44 will be on and transistor 46 will be off. In this situation, the value of the data that is present on node ND2 will be stored (preloaded) onto capacitive storage element 48 (i.e., capacitor 48 will be preloaded with data). When the signal on line RWL is asserted (e.g., taken high to Vcc), transistor 44 will be turned off to isolate storage element 48 from bistable element 40 while transistor 46 is turned on to transfer the data from capacitive storage element 48 to read data line RBL.

Because there are two ports in memory cell 20 of FIG. 7 (i.e., the write port formed from transistor 80 and the read port formed from read circuitry 42), memory cell 20 of FIG. 7 may be referred to as a dual port memory element. Data is written using only a single write address transistor 80 in the FIG. 7 example, but, if desired, a differential data writing scheme of the type shown in FIG. 8 may be used to perform write operations.

Figure 8:
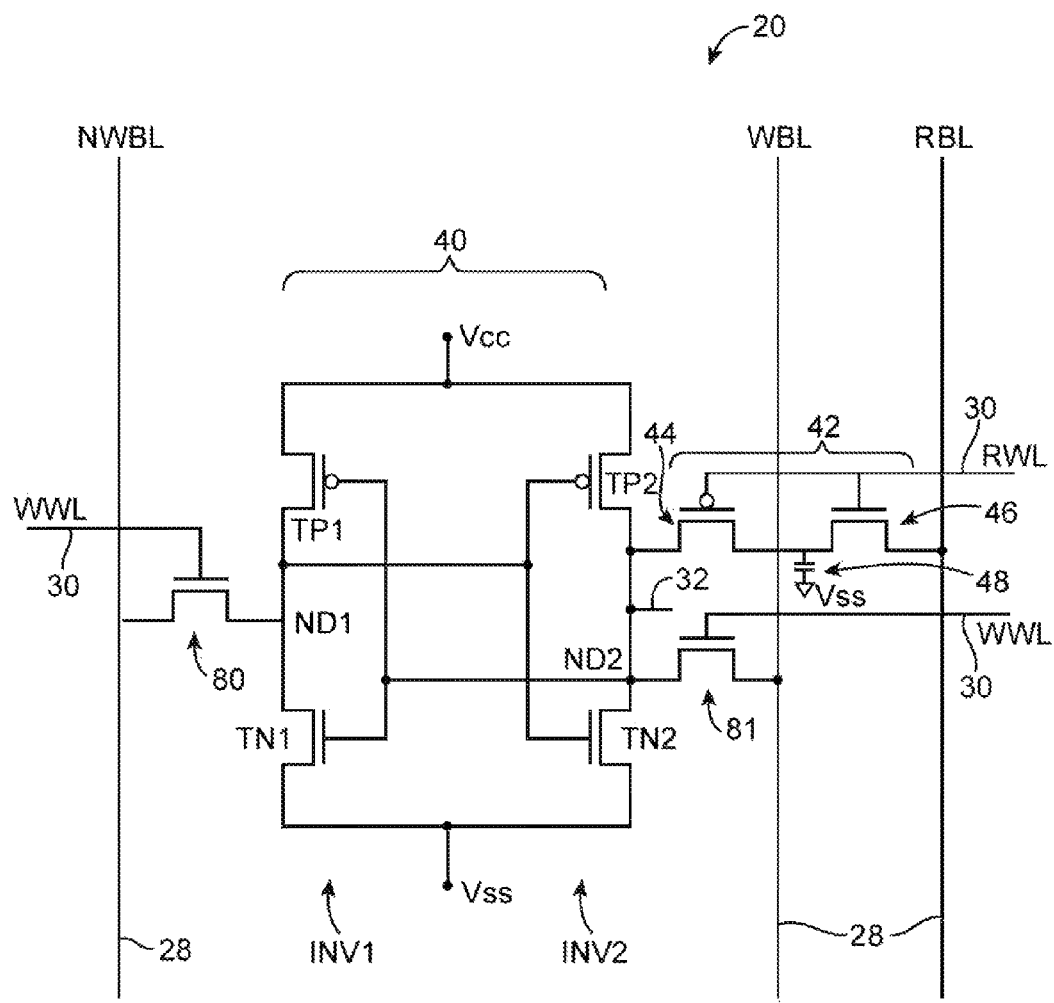
FIG. 8 is a circuit diagram of an illustrative dual port memory element having a pair of write address transistors and a read circuit with a capacitive storage element in accordance with an embodiment of the present invention.

As shown in the illustrative memory element configuration of FIG. 8, memory element 20 may, if desired, have a first write address transistor such as transistor 80 and a second write address transistor such as transistor 81. Transistor 80 may be controlled by a write address signal applied to the gate of write address transistor 80 from read-write control circuitry 24 via address line WWL. Transistor 81 may be controlled by a write address signal applied to the gate of write address transistor 81 from read-write control circuitry 24 via address line WWL. Data to be loaded into memory element 20 (i.e., data to be stored in bistable storage element 40) may be placed on data line WBL and (in complementary form) NWBL. When the write address signal is asserted (i.e., when the voltage on write address line WWL is taken high), data from line WBL and corresponding complementary data from line NBL may be written onto nodes ND2 and ND1 of element 40, respectively.

Read circuitry 42 may be used at the same time that write address transistors 80 and 81 are being used to load data into data storage element 40. For example, a read address signal may be asserted on read address line RWL at the same time that the write address signal is asserted on write address lines WWL.

Because the write address signal on write address line WWL may be asserted at the same time that the read address signal on read address line RWL, it is not necessary to wait for the read address signal on line RWL to be deasserted before asserting the write address signal. This may allow memory element 20 and therefore integrated circuit 10 to exhibit enhanced memory access speed.

Figure 9:
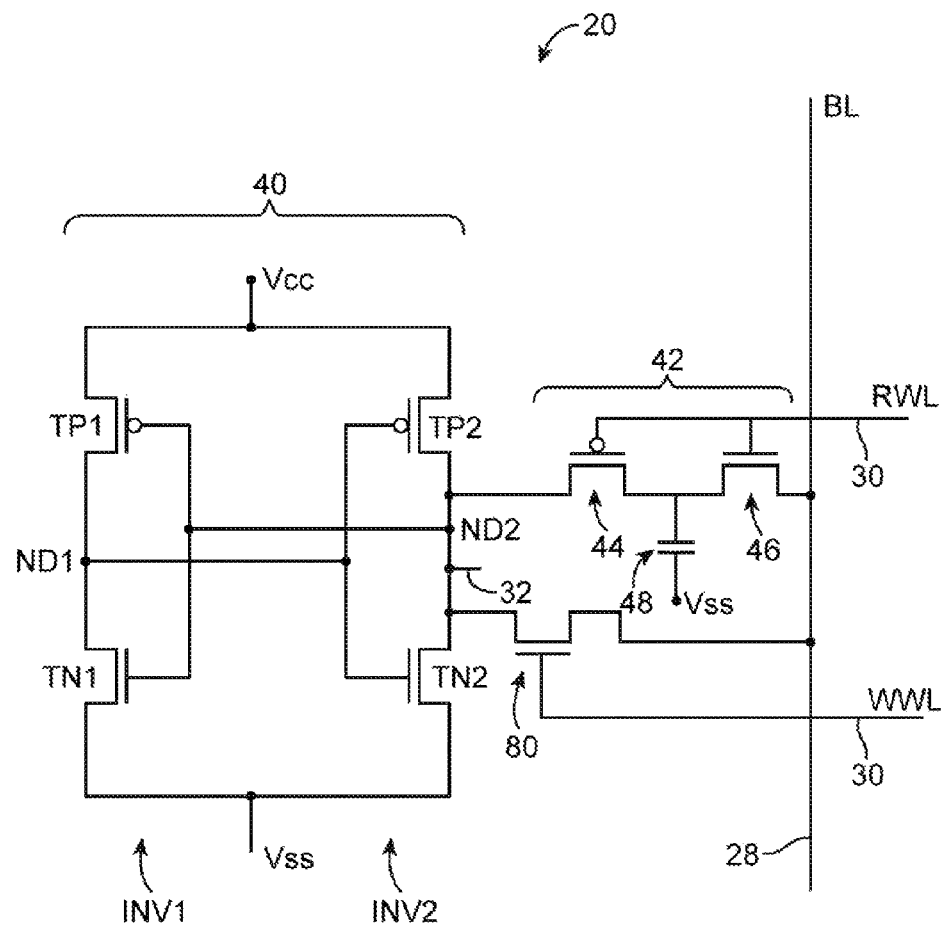
FIG. 9 is a circuit diagram of an illustrative single port memory element having a read circuit with a capacitive storage element in accordance with an embodiment of the present invention.

Another illustrative configuration (i.e., a single-port configuration) that may be used for memory element 20 (e.g., in user memory or configuration random-access memory) is shown in FIG. 9. In the arrangement shown in FIG. 9, data is conveyed to and from memory element 20 using a single data line (data line BL) that is shared between read circuitry 42 and write address transistor 80.

To load data, read-write control circuitry 24 (FIG. 2) may place the data that is to be loaded into memory element 20 on data line BL. Read-write control circuitry 24 may then assert a write address signal on write address line WWL, turning on write address transistor 80 and driving the data from data line BL onto node ND2.

When the signal on read address line RWL is low, transistor 44 is on, which preloads the data from node ND2 onto capacitive storage element 48 of read circuitry 42. When it is desired to read data from memory element 20, a read address signal on read address line RWL may be asserted by read-write control circuitry 24, turning on transistor 46 and transferring the preloaded data from capacitive storage element 48 onto data line BL. In arrangements of the type shown in FIG. 9, write address transistor 80 may be made as large as desired (i.e., with a gate width that is as large as desired) without adversely affecting read margin. Read transistor 46 may be made as small as desired (i.e., with a gate length that is as small as desired) without concern about adversely affecting write margin.

The foregoing is merely illustrative of the principles of this invention and various modifications can be made by those skilled in the art without departing from the scope and spirit of the invention.

What is claimed is:

1. A memory element, comprising:
   a bistable storage element;
   a bit line; and
   read circuitry coupled between the storage element and the bit line, wherein the read circuitry includes at least one temporary memory element operable to receive data from the bistable storage element and includes at least one transistor having a first source-drain terminal that is coupled to the bistable storage element and a second source-drain terminal that is coupled to the temporary memory element.

2. The memory element defined in claim 1 wherein the temporary memory element comprises a capacitor coupled to a data storage node that is operable to receive data from the bistable storage element.

3. The memory element defined in claim 2 wherein the capacitor has a first terminal coupled to the data storage node and a second terminal coupled to ground.

4. The memory element defined in claim 3, wherein the at least one transistor also has a gate that receives a read address signal, and wherein the read circuitry further includes
   an additional transistor coupled between the data storage node and the bit line, wherein the second transistor has a gate operable to receive the read address signal.

5. The memory element defined in claim 4 wherein the at least one transistor comprises a p-channel metal-oxide-semiconductor transistor.

6. The memory element defined in claim 5 wherein the additional transistor comprises an n-channel metal-oxide-semiconductor transistor.

7. The memory element defined in claim 2 wherein the capacitor comprises a capacitor structure selected from the group consisting of: a metal-oxide-semiconductor capacitor structure, a trench capacitor structure, and a metal-insulator-metal capacitor structure.

8. The memory element defined in claim 1 further comprising at least one write address transistor coupled to the bistable storage element.

9. The memory element defined in claim 8 wherein the write address transistor has a first terminal coupled to the bistable storage element and a second terminal coupled to the bit line.

10. The memory element defined in claim 8 wherein the bit line comprises a read data line, the memory element further comprising at least one write data line, wherein the write address transistor is coupled between the write data line and the bistable storage element.

11. The memory element defined in claim 1 further comprising:
   a first write data line;
   a first write address transistor coupled between the first write data line and the bistable storage element;
   a second write data line; and
   a second write address transistor coupled between the second write data line and the bistable storage element.

12. The memory element defined in claim 11 wherein the first write address transistor has a first gate, wherein the second write address transistor has a second gate, and wherein the first and second gates are coupled to a write address line.

13. The memory element defined in claim 1 wherein the bistable storage element comprises first and second inverters.

14. Memory element circuitry, comprising:
   a bistable data storage element;
   a read data line;
   a write data line;
   an address line;
   read circuitry coupled between the bistable data storage element and the read data line, wherein the read circuitry includes a data storage node, a temporary passive memory element coupled to the data storage node, a first transistor having a first source-drain terminal that is coupled to the bistable data storage element and a second source-drain terminal that is coupled to the data storage node, a second transistor having a first source-drain terminal that is coupled to the data storage node and a second source-drain terminal that is coupled to the read data line, wherein the first and second transistors have gates that are coupled to the address line, and wherein the temporary passive memory element is operable to temporarily store data from the bistable data storage element on the data storage node; and
   write circuitry coupled between the bistable data storage element and the write data line.

15. The memory element circuitry defined in claim 14 wherein the write circuitry comprises a write address transistor coupled between the write data line and the bistable data storage element.

16. A method of operating memory element circuitry having a bistable data storage element that is coupled to a bit line by read circuitry that includes a data storage node coupled to a temporary memory element, comprising:
   supplying data from the bistable data storage element to the data storage node during a read operation, wherein the read operation outputs the data to the bit line, wherein the read operation comprises:
      when a read address signal is deasserted, passing the data from the bistable data storage element to the data storage node via a first transistor in the read circuitry; and
      when the read address signal is asserted, outputting the data to the bit line via a second transistor in the read circuitry.

17. The method defined in claim 16 wherein the temporary memory element comprises a capacitor and wherein supplying data from the bistable data storage element comprises storing the data on the data storage node using the capacitor, the method further comprising supplying the data from the data storage node to the bit line through at least one transistor in the read circuitry.

18. The method defined in claim 17 further comprising:
   writing data into the bistable data storage element with write circuitry that is coupled to the bistable data storage element.

* * * * *